US012620993B1

(12) United States Patent
Lewis et al.

(10) Patent No.: US 12,620,993 B1
(45) Date of Patent: May 5, 2026

(54) BALLISTIC SUPERCONDUCTING CIRCUIT FOR ASYNCHRONOUS REVERSIBLE LOGIC ELEMENT

(71) Applicant: National Technology & Engineering Solutions of Sandia, LLC, Albuquerque, NM (US)

(72) Inventors: Rupert M. Lewis, Albuquerque, NM (US); Michael P. Frank, Albuquerque, NM (US); Steven B. Kaplan, Estes Park, CO (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 0 days.

(21) Appl. No.: 19/045,208

(22) Filed: Feb. 4, 2025

(51) Int. Cl.
| | |
|---|---|
| *H03K 19/195* | (2006.01) |
| *G01R 33/035* | (2006.01) |
| *G11C 11/16* | (2006.01) |
| *G11C 11/44* | (2006.01) |

(52) U.S. Cl.
CPC ....... *H03K 19/195* (2013.01); *G01R 33/0354* (2013.01); *G11C 11/1673* (2013.01); *G11C 11/44* (2013.01)

(58) Field of Classification Search
CPC ... H03K 19/195; G11C 11/44; G11C 11/1673; G01R 33/0354
USPC ........... 326/1, 3, 6, 7; 327/336, 367; 377/64, 377/66, 73, 81
See application file for complete search history.

(56) References Cited

U.S. PATENT DOCUMENTS 11,289,156 B2 * 3/2022 Frank .................. G01R 33/0354

OTHER PUBLICATIONS

Frank et al.Sandia Ballistic Asynchronous Reversible Computing in Superconducting Circuits. https://www.sandia.gov/app/uploads/sites/210/2022/12/FrankLewis_ICRC22_final2SAND.pdf (Year: 2022).*

* cited by examiner

*Primary Examiner* — Arnold M Kinkead
(74) *Attorney, Agent, or Firm* — Yee & Associates, P.C.; Gregory M. Doudnikoff; Merle W. Richman

(57) ABSTRACT

A ballistic, asynchronous logic circuit includes a controlled barrier which has a reversible memory cell and a polarity filter. The polarity filter is inductively coupled to the reversible memory cell. The circuit includes first and second polarity separators connected to the controlled barrier. The circuit includes a circulator connected to the controlled barrier.

20 Claims, 4 Drawing Sheets

SWITCH GATE
200

300

| CONTROL INPUT FLUXON | INPUT DATA FLUXON | CONTROL OUTPUT FLUXON | OUTPUT DATA FLUXON | COMPLEMENTARY OUTPUT DATA FLUXON |
|---|---|---|---|---|
| NONE | NONE | NONE | NONE | NONE |
| NONE | (+) | NONE | NONE | (+) |
| (+) | NONE | (+) | NONE | NONE |
| (+) | (+) | (+) | (+) | NONE |

BALLISTIC SUPERCONDUCTING CIRCUIT FOR ASYNCHRONOUS REVERSIBLE LOGIC ELEMENT

STATEMENT OF GOVERNMENT INTEREST

This invention was made with Government support under Contract No. DE-NA0003525 awarded by the United States Department of Energy/National Nuclear Security Administration. The U.S. Government has certain rights in the invention.

BACKGROUND INFORMATION

1. Field

The present disclosure relates generally to logic circuits, and more specifically to a ballistic superconducting circuit for an asynchronous logic element.

2. Background

Logic circuits (e.g., AND gates, OR gates, NOR gates, XOR gates) form the foundation of digital circuits. Traditionally, logic circuits are implemented using semiconductor-based technologies, such as CMOS transistors. While these devices have been scaled successfully to nanometer dimensions, their continued evolution faces several challenges.

Current CMOS-based logic circuits operate irreversibly, dissipating significant amounts of energy in the form of heat for bits of information processed. This results from the fundamental thermodynamic limits of irreversible computation, posing a barrier to further miniaturization and energy efficiency in high-performance computing systems.

Also, the switching speed of conventional gates is limited by parasitic capacitance, resistance, and the inherent delay in charging and discharging these components. This impacts the performance of processors, especially as clock frequencies continue to increase.

Ballistic superconducting circuits rely on superconducting properties of materials. These circuits use flux quanta or fluxons to represent logical states. Flux quanta or fluxons can propagate ballistically through a circuit. As such, these circuits can transfer information or signal without any significant dissipation. Despite their potential, the practical realization of ballistic superconducting circuits has been challenging.

SUMMARY

According to an illustrative embodiment, a ballistic, asynchronous logic circuit is provided. The circuit includes a pair of control inputs, a pair control outputs, a pair of data inputs, a pair of data outputs and a pair of complementary data outputs. The circuit includes a first polarity separator having a pair of first terminals connected to the control inputs and having a pair of second terminals and a pair of third terminals. The circuit includes a circulator having a pair of first terminals connected to the data inputs, a pair of second terminals connected to the complementary data outputs and having a pair of third terminals. The circuit includes a second polarity separator having a pair of first terminals, a pair of second terminals connected to the second terminals of the first polarity selector and a pair of third terminals connected to the control outputs. The circuit includes a superconducting controlled barrier having a pair of first terminals connected to the third terminals of the first polarity selector, a pair of second terminals connected to the third terminals of the circulator, a pair of third terminals connected to the first terminals of the second polarity selector and a pair of fourth terminals connected to the data outputs.

In an illustrative embodiment, the superconducting controlled barrier includes a reversible memory cell having a pair of first terminals connected to the third terminals of the first polarity separator and a pair of second terminals connected to the first terminals of the second polarity separator. The controlled barrier includes a polarity filter inductively coupled to the reversible memory cell and having a pair of first terminals connected to the third terminals of the circulator and a pair of second terminals connected to the complementary data outputs.

In an illustrative embodiment, a circulating current in the reversible memory cell induces an oppositely circulating current in the polarity filter.

In an illustrative embodiment, the reversible memory cell includes a first inductor having first and second terminals and a second inductor having first and second terminals. The reversible memory cell includes a first Josephson Junction having a first terminal coupled to the first terminal of the first inductor and a second terminal connected to the first terminal of the second inductor, and a second Josephson Junction having a first terminal coupled to the second terminal of the first inductor and a second terminal connected to the second terminal of the second terminal.

In an illustrative embodiment, the polarity filter includes a first inductor having first and second terminals, a second inductor having first and second terminals, a third inductor having first and second terminals, a fourth inductor having first and second terminals, and a Josephson Junction having a first terminal coupled to the second terminal of the first inductor and connected to the first terminal of the second inductor and a second terminal connected to the second terminal of the third inductor and connected to the first terminal of the fourth inductor.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

DETAILED DESCRIPTION

Various aspects of the present disclosure are described by narrative text, schematics and block diagrams.

Figure 1:
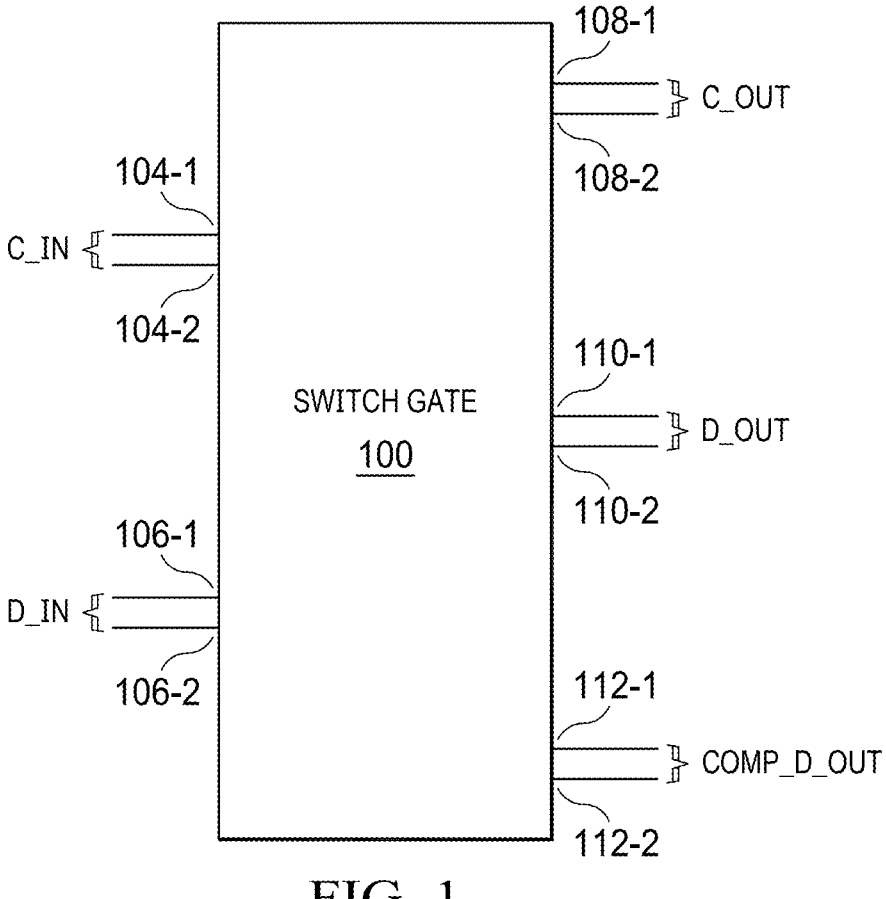
FIG. 1 illustrates a block diagram of an asynchronous reversible switch gate in accordance with an illustrative embodiment.

FIG. 1 illustrates an asynchronous, reversible switch gate 100 in accordance with an illustrative embodiment. In the illustrative embodiment, switch gate 100 is configured to implement a Boolean logic AND gate. However, switch gate 100 can also be modified or reconfigured to implement an OR gate, a NOR gate or an XOR gate.

Gate 100 is configured as an asynchronous circuit because it operates without a global clock. Instead, gate 100 relies on local interactions between components within gate 100. During operation, flux quanta or fluxons are generated and propagated within gate 100 as localized events, triggered when required by gate 100's logic state transition. Also, gate 100 is configured as a reversible logic element so that its outputs map back to their inputs. This ensures that no information is lost during computation.

Gate 100 includes control inputs 104-1 and 104-2 (e.g., terminals). Control inputs 104-1 and 104-2 jointly form a single port configured to receive control fluxon C_in. Control fluxon C_in is a localized magnetic flux quantum in a current loop which circulates in two-wire conductors coupled to control inputs 104-1 and 104-2. In the example embodiment, the two-wire conductors are constructed using Long Josephson Junction (LLJ) transmission lines.

Control fluxon C_in is a flux quantum which is used to control the state of gate 100. A flux quantum represents a discrete packet of magnetic flux used to encode binary information. For example, the presence of absence of a flux quantum of a certain polarity can represent logical 1 or logical 0. Control fluxon C_in causes a circulating current in the LLJ transmission lines. The magnetic field generated by the current in one of the lines interacts with the current in the other line to form a confined magnetic flux loop. Control fluxon C_in propagates ballistically through gate 100, maintaining its kinetic energy and enabling high-speed, low-loss transmission.

Gate 100 includes data inputs 106-1 and 106-2 (e.g., terminals) which jointly form a single port configured to receive input data fluxon D_in. Input data fluxon D_in encodes logical information by its presence or absence. The input data fluxon propagates ballistically through gate 100, maintaining its kinetic energy and enabling high-speed, low-loss transmission.

Gate 100 includes control outputs 108-1 and 108-2 (e.g., terminals) which jointly form a single port configured to provide control fluxon C_out. Control fluxon C_out is a flux quantum generated by gate 100. The fluxon can propagate to other circuits or subsequent modules to carry information.

Gate 100 includes data outputs 110-1 and 110-2 (e.g., terminals) which together form a single port configured to provide output data fluxon D_out. Output data fluxon D_out represents the processed logical state of gate 100 at data outputs 110-1 and 110-2. Output data fluxon D_out carries the results of logical operations performed by gate 100.

Gate 100 includes data outputs 112-1 and 112-2 (e.g., terminals) which together form a single port configured to provide complementary output data fluxon Comp_D_out. Complementary output data fluxon Comp_D_out is a flux quantum which represents the value of the expression ((NOT C_in) AND D_in)).

Figure 2:
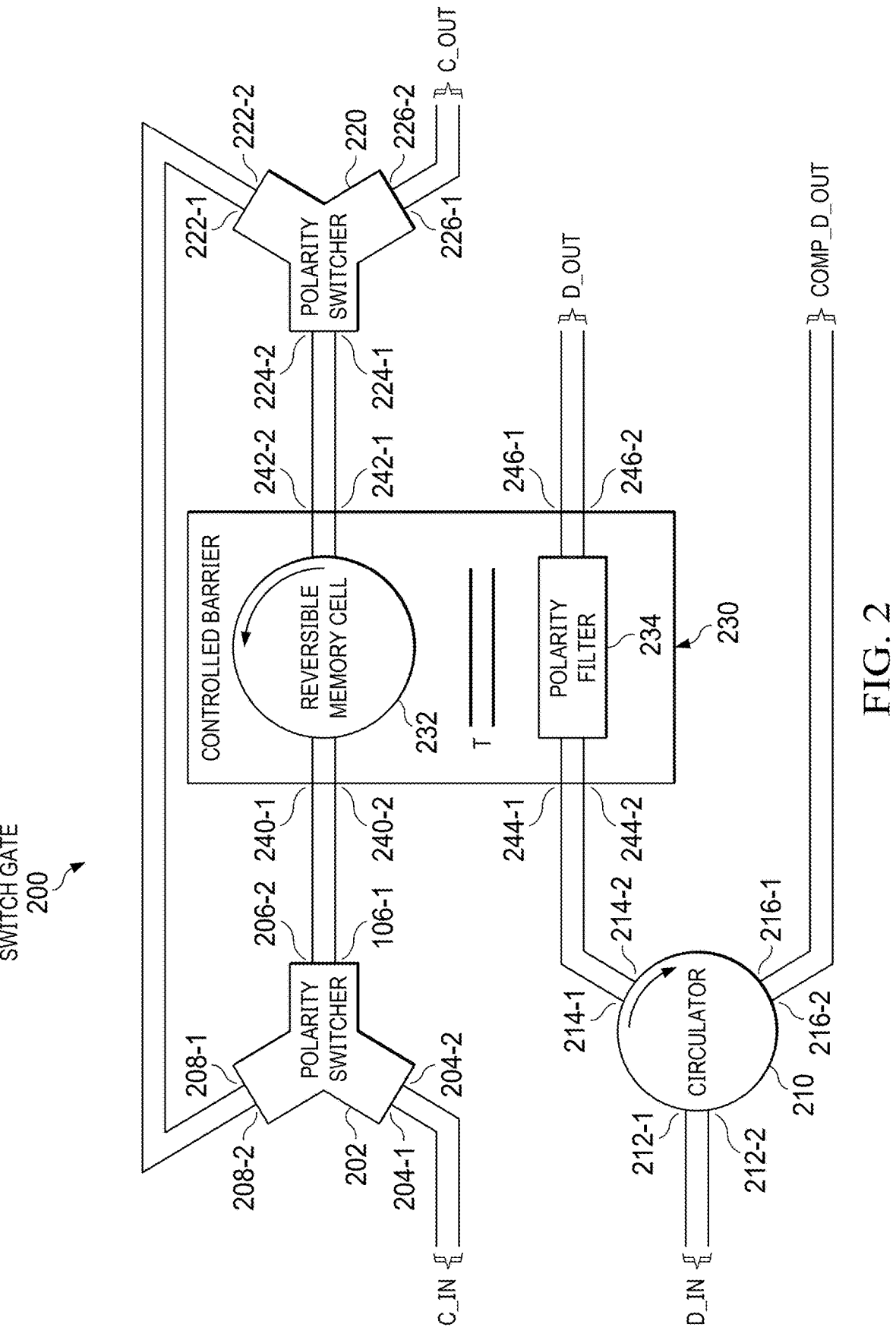
FIG. 2 illustrates components of an asynchronous reversible switch gate in accordance with an illustrative embodiment.

FIG. 2 illustrates components of asynchronous, reversible switch gate 200 in accordance with an illustrative embodiment. In this example, gate 200 (also referred to as circuit 200) implements an AND gate. However, it will be apparent to those of ordinary skill in the art that gate 200 can be modified or reconfigured to implement an OR gate, a NOR gate or an XOR gate.

Gate 200 includes first polarity selector 202 which has terminals 204-1 and 204-2 which together form a single port configured to receive control fluxon C_in. First polarity selector 202 is a superconducting circuit component designed to separate, route, or manipulate fluxons (magnetic flux quanta) based on their orientation of magnetic flux. First polarity selector 202 directs fluxons with specific polarities to different pathways or outputs.

First polarity selector 202 identifies the orientation or polarity (positive or negative) of an incoming fluxon. Orientation is determined by the direction of the circulating current or magnetic field associated with the fluxon. Once the orientation is detected, first polarity selector 202 separates fluxons into different outputs based on their polarity. In an illustrative embodiment, fluxons with positive polarity are routed to terminals 206-1 and 206-2 which jointly form a single port, while fluxons with negative polarity are routed to terminals 208-1 and 208-2 which jointly form a single port.

Gate 200 includes circulator 210 (e.g., rotary) configured to route positive fluxons directionally between multiple terminals (e.g., ports) in a specific sequence, in a unidirectional manner. Circulator 210 has multiple terminals (e.g., ports), which act as inputs and outputs for fluxons.

Circulator 210 has terminals 212-1 and 212-2 which jointly form a single port. Terminals 212-1 and 212-2 are configured to receive input data fluxon D_in. Input data fluxon D_in encodes logical information represented by its polarity. Input data fluxons propagate ballistically through circulator 210, maintaining their kinetic energy and enabling high-speed, low-loss transmission.

In an illustrative embodiment, if positive fluxons are received at terminals 212-1 and 212-2, circulator 210 routes the fluxons to terminals 214-1 and 214-2 which jointly form a single port, and if positive fluxons are received at terminals 214-1 and 214-2, circulator routes the fluxons to terminals 216-1 and 216-2 which jointly form a single port. Circulator 210 is configured to provide complementary data fluxon Comp_D_out at terminals 216-1 and 216-2 which jointly form a single port.

Gate 200 includes second polarity selector 220 which has terminals 222-1 and 222-2 connected to terminals 208-1 and 208-2, respectively, of first polarity selector 202. Second polarity selector 220 also terminals 224-1 and 224-2 and has terminals 226-1 and 226-2 configured to provide control fluxon C_out. A loop formed by first polarity selector 202, second polarity selector 220 and controlled barrier 230 is referred to as the delay loop of circuit 200.

Controlled barrier 230 is configured to manage propagation of fluxons. Controlled barrier 230 leverages the interaction between reversible memory cell 232 and polarity filter 234 to dynamically control the passage or reflection of fluxons based on their polarity. Reversible memory cell 232 is inductively coupled to polarity filter 234 via transformer T. In an example embodiment, inductors (shown in FIGS. 3 and 4) within reversible memory cell 232 and polarity filter 234 are inductively coupled to form transformer T1. As a result, a circulating current in reversible memory cell 232 induces an oppositely circulating current in polarity filter 234. The induced current creates a magnetic field that interacts with the fluxons traveling through Long Josephson Junctions which act as interconnects within module 200. Reversible memory cell 232, controlled barrier and LLJs are described with reference to FIG. 4.

Controlled barrier 230 has terminals 240-1 and 240-2 connected to respective terminals 206-1 and 206-2 of first polarity selector 202. Controlled barrier 230 has terminals 242-1 and 242-2 connected to respective terminals 224-1 and 224-2 of second polarity selector 220. Polarity filter 234 has terminals 244-1 and 244-2 connected to respective terminals 214-1 and 214-2 of circulator 210. Polarity filter 234 has terminals 246-1 and 246-2 configured to provide output data fluxon D_out.

In operation, a flux quantum of negative polarity is injected into reversible memory cell 232 during an initialization phase. This may involve sending a control fluxon of negative polarity through terminals 240-1 and 240-2 or using an external magnetic field to induce the desired flux state. Once the flux quantum of negative polarity is introduced, it is stored within the reversible memory cell's superconducting loop, causing controlled barrier 230 to be in a blocking state. In the blocking state, the magnetic field from reversible memory cell 232 causes currents within controlled barrier 230 that interfere with the passage of data fluxons. Instead, controlled barrier 230 reflects data fluxons.

Next, control fluxon C_in of positive polarity is applied to first polarity selector 202 at terminals 204-1 and 204-2. First polarity selector 202 identifies the orientation or polarity of control fluxon C_in. Orientation is determined by the direction of the circulating current or magnetic field associated with the control fluxon. The control fluxon of positive polarity is routed out to terminals 206-1 and 206-2 (while a control fluxon of negative polarity would be routed out to terminals 208-1 and 208-2).

The control fluxon of positive polarity is received by reversible memory cell 232 at terminals 240-1 and 240-2. Reversible memory cell 232 is a superconducting storage loop capable of storing a flux quantum. Reversible memory cell 232 provides a controllable magnetic state by allowing the polarity of the stored flux quantum to be updated reversibly via the external control fluxon. When a control fluxon of a positive polarity (opposite to the stored flux quantum) is applied, the stored flux quantum is ejected and replaced by the newly applied control fluxon of positive polarity, causing controlled barrier 230 to be in a passing state. When reversible memory cell 232 is in positive polarity state, the energy configuration of controlled barrier 230 is altered, inverting the effect that caused the blocking state of controlled barrier 230.

The ejection of a stored fluxon ensures that the kinetic energy of the input fluxon is preserved and transferred to an output fluxon, enabling energy-efficient operation. If, however, a control fluxon of polarity same as the stored fluxon is applied, the control fluxon is repelled by the stored fluxon.

In this example, because control fluxon C_in has positive polarity and the stored flux quantum in reversible memory cell 232 has negative polarity, the stored flux quantum is ejected by reversible memory cell 232. The ejected stored flux quantum is routed by first and second polarity selectors 202 and 220 over the delay path.

Optionally, input data fluxon D_is applied to circulator 210 at terminals 212-1 and 212-2. In this example, because controlled barrier 230 is in the passing state (i.e., reversible memory cell 232 holds a positive fluxon), input data fluxon D_in passes through polarity filter 234 and exits terminals 246-1 and 246-2 as output data fluxon D_in.

If, however, control fluxon C_in is not applied, controlled barrier 230 is held in the blocking state. As such, input data fluxon D_in is reflected by polarity filter 234 and routed by circulator 210 and exits terminals 216-1 and 216-2 as complementary output data fluxon Comp_D_out.

Gate 200 implements a Boolean logic AND gate at output D_out if C_in and D_in are applied. If C_in is not applied but D_in is applied, the complementary output Comp_D_out results. If neither C_in or D_in are applied, no output results (neither D_out nor Comp_D_out).

In an illustrative embodiment, logic 1 is represented by a positive fluxon and logic 0 by its absence. D_out outputs a logic 1 if and only if a positive fluxon is applied to C_in and then another one is applied (within a certain time window) to D_in. Comp_D_out outputs a logic 1 if and only if no fluxon is applied to C_in and then a positive fluxon is applied to D_in. If no fluxon is applied to D_in then there is no fluxon (i.e., logic 0) at both D_out and Comp_D_out.

Figure 3:
FIG. 3 illustrates a truth table of the switch gates of FIGS. 2 and 3.

FIG. 3 illustrates truth table 300 of Boolean logic states of gate 200. In table 300, a fluxon of positive polarity is indicated by (+). During a normal operation of gate 200, fluxons of negative polarity are not allowed. As shown in table 300, only if control input fluxon, and input data fluxon are applied, gate 200 generates an output data fluxon. In all other scenarios, gate 200 does not generate an output data fluxon. If a control input fluxon is not applied but an input data fluxon is applied, gate 200 generates a complementary output data fluxon. Conversely, if a control input fluxon is applied but an input data fluxon is not applied, gate 200 does not generate a complementary output data fluxon.

With reference to FIG. 2, the stored flux quantum of negative polarity is ejected by reversible memory cell 232 and replaced by the newly applied control fluxon of positive polarity. The ejected fluxon of negative polarity is routed via the delay loop and reenters reversible memory cell 232, triggering another flux exchange operation. The temporarily stored fluxon of positive polarity is ejected from reversible memory cell 232 and replaced by the fluxon of negative polarity. The ejected stored fluxon of positive polarity exits terminals 226-1 and 226-2 as fluxon {C1_out, C2_out} and reversible memory cell 232 is restored to negative polarity state.

Figure 4:
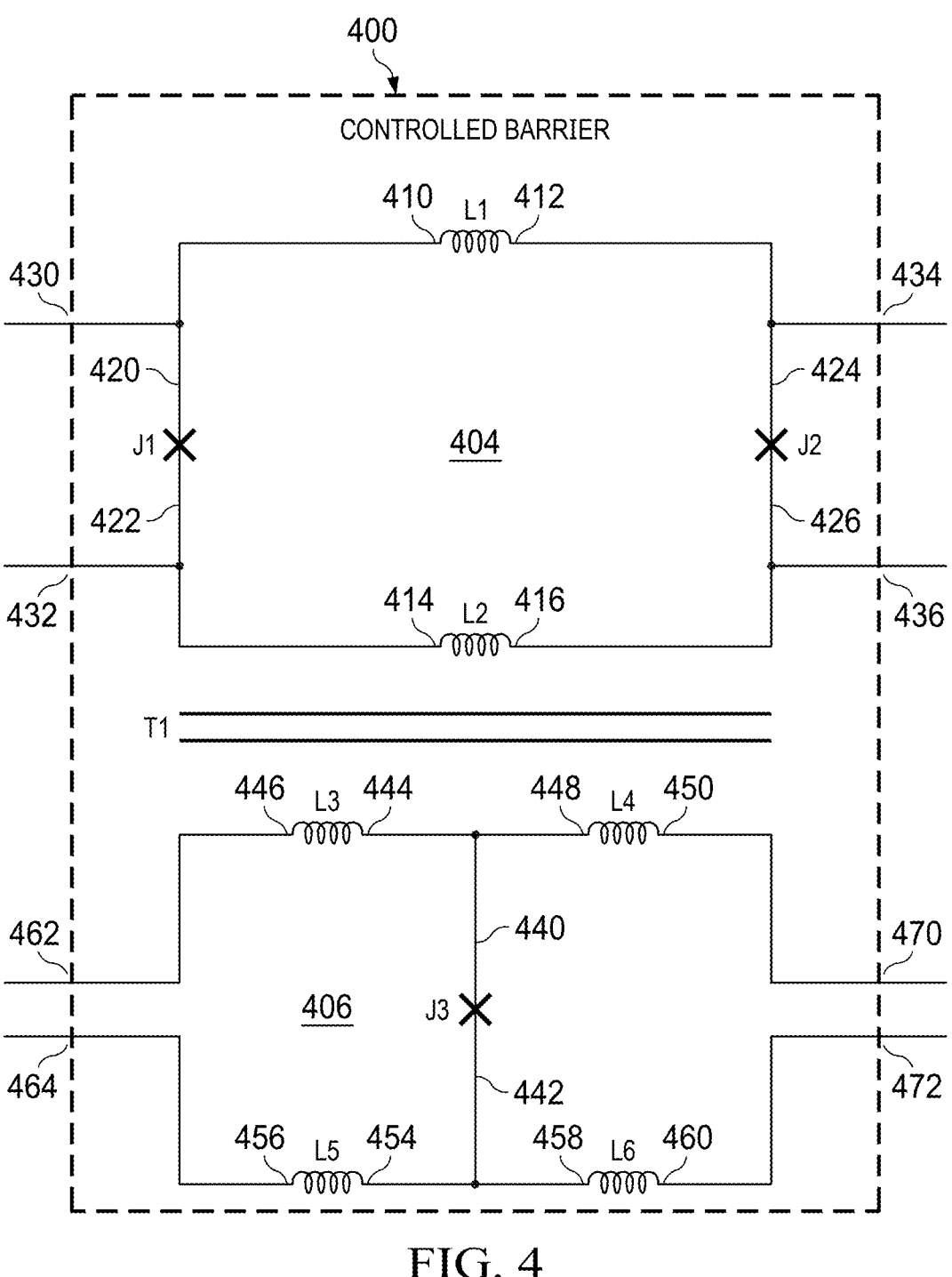
FIG. 4 illustrates a schematic of a superconducting controlled barrier in accordance with an illustrative embodiment.

FIG. 4 illustrates a schematic of superconducting controlled barrier 400 in accordance with an illustrative embodiment. Controlled barrier 400 operates as a superconducting switch gate that uses a reversible memory cell and a polarity filter to dynamically adjust its state (blocking or passing).

Controlled barrier 400 includes reversible memory cell 404 which is a two-port superconducting storage loop. Reversible memory cell 404 is configured to store a single flux quantum.

Reversible memory cell 404 includes first inductor L1 which has terminals 410 and 412. Reversible memory cell 404 includes second inductor L2 which has terminals 414 and 416.

Reversible memory cell 404 includes first Josephson Junction J1 which has terminal 420 connected to terminal 410 of first inductor L1 and has terminal 422 connected to terminal 414 of second inductor L2. Reversible memory cell 404 includes second Josephson Junction J2 which has terminal 424 connected to terminal 412 of first inductor L1 and has terminal 426 connected to terminal 416 of second inductor L2.

Reversible memory cell 404 includes control terminals 430 and 432 connected to respective terminals 420 and 422 of first Josephson Junction J1. Terminals 430 and 432 jointly form a port configured to receive a control fluxon.

Reversible memory cell 404 includes control terminals 434 and 436 connected to respective terminals 424 and 426 of second Josephson Junction J2. Control terminals 434 and 436 jointly form a port configured to return ejected fluxons via the delay loop (shown in FIG. 2) back to reversible memory cell 404.

Josephson Junctions J1 and J2 are superconducting devices that allow the flow of supercurrent without resistance up to a critical current. They exhibit quantum effects, such as tunneling and phase coherence. The voltage-current relationship in the Josephson Junctions are highly nonlinear, and they can switch between resistive and non-resistive states based on the applied current or magnetic flux.

Controlled barrier 400 includes polarity filter 406 which includes Josephson Junction J3 which has terminals 440 and 442. Polarity filter 406 includes third inductor L3 which has terminal 444 connected to terminal 440 of J3 and has terminal 446. Polarity filter 406 includes fourth inductor L4 which has terminal 448 connected to terminal 440 of J3 and has terminal 450.

Polarity filter 406 includes fifth inductor L5 which has terminal 454 connected to terminal 442 of J3 and has terminal 456. Polarity filter 406 includes sixth inductor L6 which has terminal 458 connected to terminal 442 of J3 and has terminal 460.

Polarity filter 406 includes input terminal 462 connected to terminal 446 of third inductor L3 and includes input terminal 464 connected to terminal 456 of fifth inductor L5. Input terminals 462 and 464 jointly form a port configured to receive input data fluxons (shown in FIG. 2).

Polarity filter 406 includes output terminal 470 connected to terminal 450 of fourth inductor L4 and includes output terminal 472 connected to terminal 460 of sixth inductor L6. Output terminals 470 and 472 jointly form a port configured to provide output data fluxons (shown in FIG. 2).

Polarity filter 406 is inductively coupled to reversible memory cell 404 via transformer T. In an example embodiment, transformer T is formed by inductors L2, L3 and L4. In other embodiments, transformer T is formed by coupling six inductors (L1-L6) is an appropriate configuration. Due to inductive coupling, a circulating current in reversible memory cell 404 induces an oppositely circulating current in polarity filter 406. As such, the state of polarity filter 406 is controlled by reversible memory cell 404. In an example embodiment, if the polarity of reversible memory cell 404 is set to negative polarity, polarity filter 406 reflects incoming positive data fluxons, and thus controlled barrier 400 is held in a blocking state. Conversely, if reversible memory cell 404 is set to positive polarity, polarity filter 406 allows positive data fluxons to pass through, and thus controlled barrier 400 is held in a passing state. In the passing state, incoming data fluxons pass through polarity filter 406 and exit terminals 470 and 472 as output data fluxons (shown in FIG. 2).

In an example embodiment, one or more interconnects within gate 100 and gate 200 can be formed using Long Josephson Junctions (LLJs). More specifically, one or more interconnects within and between reversible memory cells, polarity filters, circulators and polarity selectors can be formed using LLJs or a continuous LLJ structure. The LJJ may either be implemented as a continuous (e.g., one long Josephson Junction) or discrete (many parallel Josephson Junctions) structure. Each junction in the chain introduces a nonlinear phase relation between the superconducting regions it connects. Inductors are placed between adjacent Josephson Junctions to store magnetic energy and control the coupling strength between them. This structure allows the LJJ to support the propagation of fluxons, behaving like a nonlinear transmission line.

As used herein, a first component "connected to" a second component means that the first component can be connected directly or indirectly to the second component. In other words, additional components may be present between the first component and the second component. The first component is considered to be indirectly connected to the second component when one or more additional components are present between the two components. When the first component is directly connected to the second component, no additional components are present between the two components.

As used herein, the phrase "a number" means one or more. The phrase "at least one of", when used with a list of items, means different combinations of one or more of the listed items may be used, and only one of each item in the list may be needed. In other words, "at least one of" means any combination of items and number of items may be used from the list, but not all of the items in the list are required. The item may be a particular object, a thing, or a category.

For example, without limitation, "at least one of item A, item B, or item C" may include item A, item A and item B, or item C. This example also may include item A, item B, and item C or item B and item C. Of course, any combinations of these items may be present. In some illustrative examples, "at least one of" may be, for example, without limitation, two of item A; one of item B; and ten of item C; four of item B and seven of item C; or other suitable combinations.

The block diagrams in the different depicted embodiments illustrate the architecture, functionality, and operation of some possible implementations of apparatuses and methods in an illustrative embodiment. In this regard, each block in the block diagrams may represent at least one of a module, a segment, a function, or a portion of an operation or step. For example, one or more of the blocks may be implemented as program code.

In some alternative implementations of an illustrative embodiment, the function or functions noted in the blocks may occur out of the order noted in the figures. For example, in some cases, two blocks shown in succession may be performed substantially concurrently, or the blocks may sometimes be performed in the reverse order, depending upon the functionality involved. Also, other blocks may be added in addition to the illustrated blocks in a flowchart or block diagram.

The description of the different illustrative embodiments has been presented for purposes of illustration and description and is not intended to be exhaustive or limited to the embodiments in the form disclosed. Many modifications and variations will be apparent to those of ordinary skill in the art. Further, different illustrative embodiments may provide different features as compared to other illustrative embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A ballistic, asynchronous logic circuit comprising: a pair of control inputs; a pair control outputs; a pair of data inputs; a pair of data outputs; a pair of complementary data outputs; a first polarity separator having a pair of first terminals connected to the control inputs and having a pair of second terminals and a pair of third terminals; a circulator having a pair of first terminals connected to the pair of data inputs, a pair of second terminals connected to the pair of complementary data outputs and having a pair of third terminals; a second polarity separator having a pair of first terminals, a pair of second terminals connected to the second terminals of the first polarity selector and a pair of third terminals connected to the control outputs; and a superconducting controlled barrier having a pair of first terminals connected to the third terminals of the first polarity selector, a pair of second terminals connected to the third terminals of the circulator, a pair of third terminals connected to the first terminals of the second polarity selector and a pair of fourth terminals connected to the pair of complementary data outputs.

2. The circuit of claim 1, wherein the superconducting controlled barrier comprises: a reversible memory cell having a pair of first terminals connected to the third terminals of the first polarity separator and a pair of second terminals connected to the first terminals of the second polarity separator; and a polarity filter inductively coupled to the reversible memory cell and having a pair of first terminals connected to the third terminals of the circulator and a pair of second terminals connected to the pair of complementary data outputs.

3. The circuit of claim 2, wherein a circulating current in the reversible memory cell induces an oppositely circulating current in the polarity filter.

4. The circuit of claim 2, wherein the reversible memory cell comprises:
a first inductor having first and second terminals;
a second inductor having first and second terminals;
a first Josephson Junction having a first terminal coupled to the first terminal of the first inductor and a second terminal connected to the first terminal of the second inductor;
a second Josephson Junction having a first terminal coupled to the second terminal of the first inductor and a second terminal connected to the second terminal of the second terminal.

5. The circuit of claim 2, wherein the polarity filter comprises:
a first inductor having first and second terminals;
a second inductor having first and second terminals;
a third inductor having first and second terminals;
a fourth inductor having first and second terminals;
a Josephson Junction comprising:
a first terminal coupled to the second terminal of the first inductor and connected to the first terminal of the second inductor;
a second terminal connected to the second terminal of the third inductor and connected to the first terminal of the fourth inductor.

6. The circuit of claim 1, wherein:
the pair of control inputs are configured to receive control input fluxons; and
the pair control outputs are configured to provide control output fluxons.

7. The circuit of claim 1, wherein:
the pair of data inputs are configured to receive input data fluxons;
the pair of data outputs are configured to provide output data fluxons; and
the pair of complementary data outputs are configured to provide complementary output data fluxons.

8. A ballistic, asynchronous logic circuit comprising:
a first polarity separator having a pair of first terminals coupled to receive to control input fluxons and having a pair of second terminals and a pair of third terminals;
a circulator having a pair of first terminals coupled to receive to data input fluxons, a pair of second terminals configured to provide complementary output data fluxons and having a pair of third terminals;
a second polarity separator having a pair of first terminals, a pair of second terminals connected to the second terminals of the first polarity separator and a pair of third terminals configured to provide control output fluxons; and a superconducting controlled barrier having a pair of first terminals connected to the third terminals of the first polarity selector, a pair of second terminals connected to the third terminals of the circulator, a pair of third terminals connected to the first terminals of the second polarity selector and a pair of fourth terminals configured to provide output data fluxons.

9. The circuit of claim 8, wherein the superconducting controlled barrier comprises:
a reversible memory cell having a pair of first terminals connected to the third terminals of the first polarity separator and a pair of second terminals connected to the first terminals of the second polarity separator; and
a polarity filter inductively coupled to the reversible memory cell and having a pair of first terminals connected to the third terminals of the circulator and a pair of second terminals configured to provide the complementary output data fluxons.

10. The circuit of claim 9, wherein a circulating current in the reversible memory cell induces an oppositely circulating current in the polarity filter.

11. The circuit of claim 9, wherein the reversible memory cell comprises:
a first inductor having first and second terminals;
a second inductor having first and second terminals;
a first Josephson Junction having a first terminal coupled to the first terminal of the first inductor and a second terminal connected to the first terminal of the second inductor;
a second Josephson Junction having a first terminal coupled to the second terminal of the first inductor and a second terminal connected to the second terminal of the second terminal.

12. The circuit of claim 9, wherein the polarity filter comprises:
a first inductor having first and second terminals;
a second inductor having first and second terminals;
a third inductor having first and second terminals;
a fourth inductor having first and second terminals;
a Josephson Junction having a first terminal coupled to the second terminal of the first inductor and connected to the first terminal of the second inductor and having a second terminal connected to the second terminal of the third inductor and connected to the first terminal of the fourth inductor.

13. A superconducting controlled barrier comprising:
a reversible memory cell comprising:
a pair of first terminals configured to receive control fluxons and a pair of second terminals configured to receive ejected fluxons; and
a polarity filter comprising:
a pair of first terminals configured to receive input data fluxons;
a pair of second terminals configured to provide output data fluxons,
wherein the polarity filter is inductively coupled to the reversible memory cell.

14. The controlled barrier of claim 13, wherein a circulating current in the reversible memory cell induces an oppositely circulating current in the polarity filter.

15. The controlled barrier of claim 13, wherein the reversible memory cell comprises:
a first inductor having first and second terminals;
a second inductor having first and second terminals;

a first Josephson Junction having a first terminal coupled to the first terminal of the first inductor and a second terminal connected to the first terminal of the second inductor;

a second Josephson Junction having a first terminal coupled to the second terminal of the first inductor and a second terminal connected to the second terminal of the second terminal.

16. The controlled barrier of claim 13, wherein the polarity filter comprises:

a first inductor having first and second terminals;

a second inductor having first and second terminals;

a third inductor having first and second terminals;

a fourth inductor having first and second terminals;

a Josephson Junction comprising:

a first terminal coupled to the second terminal of the first inductor and connected to the first terminal of the second inductor;

a second terminal connected to the second terminal of the third inductor and connected to the first terminal of the fourth inductor.

17. The controlled barrier of claim 13, wherein the controlled barrier is set to a blocking state by applying a control fluxon of negative polarity to the reversible memory cell.

18. The controlled barrier of claim 13, wherein the controlled barrier is set to a passing state by applying a control a fluxon of positive polarity to the reversible cell.

19. The controlled barrier of claim 17, wherein the polarity filter reflects data fluxons in the blocking state.

20. The controlled barrier of claim 18, wherein the polarity filter allows data fluxons to pass through in the passing state.

* * * * *